United States Patent
Ahn et al.

(10) Patent No.: US 11,496,146 B2
(45) Date of Patent: Nov. 8, 2022

(54) APPARATUS FOR OUTPUTTING SOUND SOURCE BY APPLYING PLURALITY OF DACS AND OPERATING METHOD THEREOF

(71) Applicant: Dreamus Company, Seoul (KR)

(72) Inventors: Ji Heon Ahn, Yongin (KR); Jae Hyuk Kim, Seoul (KR)

(73) Assignee: Dreamus Company, Seoul (KR)

( * ) Notice: Subject to any disclaimer, the term of this patent is extended or adjusted under 35 U.S.C. 154(b) by 24 days.

(21) Appl. No.: 17/361,268

(22) Filed: Jun. 28, 2021

(65) Prior Publication Data

US 2022/0140839 A1    May 5, 2022

(30) Foreign Application Priority Data

Nov. 3, 2020   (KR) .................. 10-2020-0145102

(51) Int. Cl.
   *H03M 1/66*   (2006.01)
   *H03M 1/06*   (2006.01)
(52) U.S. Cl.
   CPC ........... *H03M 1/66* (2013.01); *H03M 1/0626* (2013.01)
(58) Field of Classification Search
   CPC .............................. H03M 1/66; H03M 1/0626
   USPC .................................................. 341/141, 144
   See application file for complete search history.

(56) References Cited

U.S. PATENT DOCUMENTS

| | | | | |
|---|---|---|---|---|
| 8,411,877 | B2 * | 4/2013 | Larsen | H03G 5/005 |
| | | | | 381/98 |
| 10,298,245 | B1 | 5/2019 | De Berti et al. | |
| 2002/0198614 | A1 * | 12/2002 | Sutherland | G06F 3/16 |
| | | | | 700/94 |

FOREIGN PATENT DOCUMENTS

| | | | |
|---|---|---|---|
| KR | 100273880 B1 | 12/2000 | |
| KR | 20090023969 A | 3/2009 | |
| KR | 20100068756 A | 6/2010 | |
| KR | 101519087 B1 | 5/2015 | |
| KR | 20150115308 A | 10/2015 | |

OTHER PUBLICATIONS

Becky Roberts, "Astell & Kern SE200 music player promises sonic versatility from multiple DACs", What Hi-Fi? Newsletter, Jun. 26, 2020.

* cited by examiner

*Primary Examiner* — Khai M Nguyen

(57) ABSTRACT

Disclosed are a sound source output apparatus applying a plurality of DACs and an operating method thereof. The sound source output apparatus according to the exemplary embodiment of the present disclosure includes a sound source acquiring unit which acquires a sound source signal; a tag identification processing unit which identifies tag information about the sound source signal; a DAC selection control unit which selects a specific DAC among a plurality of digital analog converters (DACs) based on a tag identification result of the tag information or a user input signal; and a sound source output unit which outputs a sound source which is converted by the selected specific DAC.

10 Claims, 4 Drawing Sheets

APPARATUS FOR OUTPUTTING SOUND SOURCE BY APPLYING PLURALITY OF DACS AND OPERATING METHOD THEREOF

CROSS-REFERENCE TO RELATED APPLICATIONS

This application claims priority to and the benefit of Korean Patent Application No. 10-2020-0145102 filed in the Korean Intellectual Property Office on Nov. 3, 2020, the entire contents of which are incorporated herein by reference.

BACKGROUND

Field

The present disclosure relates to an apparatus for outputting a sound source by applying a plurality of DACs and an operating method thereof.

Description of the Related Art

The contents described in this section merely provide background information on the exemplary embodiment of the present disclosure, but do not constitute the related art.

A general sound source output apparatus applies a digital to analog converting circuit (hereinafter, abbreviated as a DAC) manufactured by the same company. As illustrated in FIG. 1, a general sound source output apparatus sends a sound source signal to the DAC 120 of the same company through one sound source output path (audio path) and reproduces the sound source signal.

Therefore, the user cannot have a separate option other than a digital-analog converting circuit which is designated by the manufacturer. That is, the user may listen to only a sound created by one digital-analog converting circuit selected by the manufacturer at the time of manufacturing.

SUMMARY

A main object of the present disclosure is to provide a sound source output apparatus which identifies tag information about a sound source signal and applies a plurality of DACs which outputs a sound source through a sound source output path for a specific DAC selected among a plurality of DACs based on a tag identification result of the tag information and a user input signal and an operating method thereof.

According to an aspect of the present disclosure, in order to achieve the above-described object, a sound source output apparatus includes: a sound source acquiring unit which acquires a sound source signal; a tag identification processing unit which identifies tag information about the sound source signal; a DAC selection control unit which selects a specific DAC among a plurality of digital analog converters (DACs) based on a tag identification result of the tag information or a user input signal; and a sound source output unit which outputs a sound source which is converted by the selected specific DAC.

According to another aspect of the present disclosure, in order to achieve the above-described object, a sound source output method includes: a sound source acquiring step of acquiring a sound source signal; a tag identification processing step of identifying tag information about the sound source signal; a DAC selection control step of selecting a specific DAC among a plurality of digital analog converters (DACs) based on a tag identification result of the tag information or a user input signal; and a sound source output step of outputting a sound source which is converted by the selected specific DAC.

As described above, according to the present disclosure, a sound source to be output may be individually or simultaneously provided by selecting a circuit desired by a user among at least two DAC circuits.

Further, according to the present disclosure, a DAC circuit optimized for a characteristic of a sound source is selected in accordance with tag information of a sound source by an automatic tag identifying function to output a sound source.

Further, according to the present disclosure, a DAC circuit and a DAC filter optimized for a characteristic of a sound source in accordance with the tag information of the sound source are combined to provide the most ideal sound source output to the user.

DETAILED DESCRIPTION OF THE EMBODIMENT

Hereinafter, exemplary embodiments of the present disclosure will be described in detail with reference to the accompanying drawings. In the description of the present disclosure, if it is considered that the specific description of related known configuration or function may cloud the gist of the present disclosure, the detailed description will be omitted. Further, hereinafter, exemplary embodiments of the present disclosure will be described. However, it should be understood that the technical spirit of the invention is not restricted or limited to the specific embodiments, but may be changed or modified in various ways by those skilled in the art to be carried out. Hereinafter, a sound source output apparatus applying a plurality of DACs proposed by the present disclosure and an operating method thereof will be described in more detail with reference to the drawings.

Figure 1:
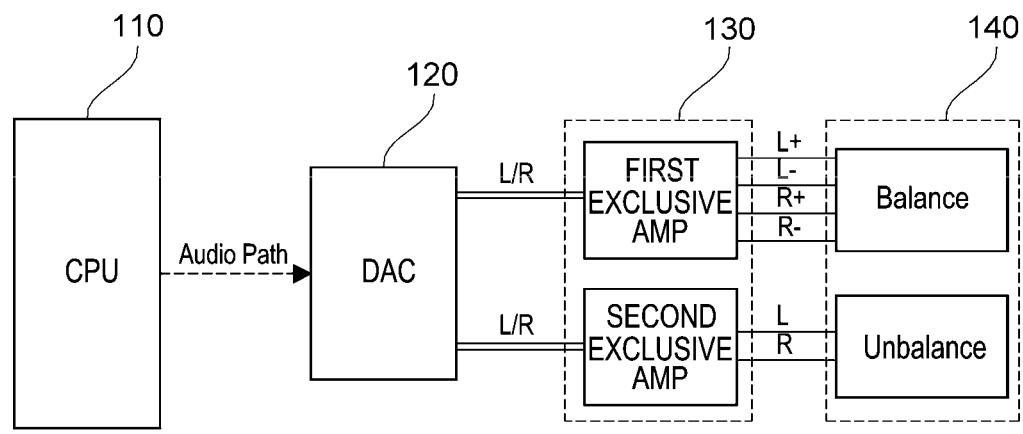
FIG. 1 is a block diagram illustrating a configuration of a sound source output apparatus of the related art.
Figure 2:
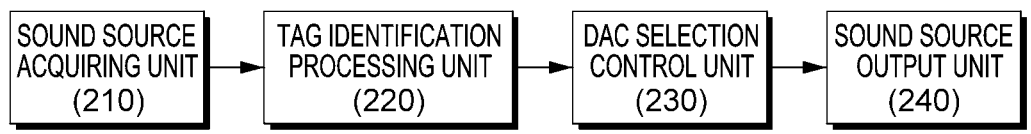
FIG. 2 is a block diagram schematically illustrating a sound source output apparatus applying a plurality of DACs according to an exemplary embodiment of the present disclosure.

FIG. 2 is a block diagram schematically illustrating a sound source output apparatus applying a plurality of DACs according to an exemplary embodiment of the present disclosure.

The sound source output apparatus 200 according to the exemplary embodiment includes a sound source acquiring unit 210, a tag identification processing unit 220, a DAC selection control unit 230, and a sound source output unit 240. The sound source output apparatus 200 of FIG. 2 is an example so that not all blocks illustrated in FIG. 2 are essential components and in the other exemplary embodiment, some blocks included in the sound source output apparatus 200 may be added, modified, or omitted.

The sound source output apparatus 200 refers to an apparatus which is interlinked with a plurality of digital analog converters (DACs) to output a sound source. The sound source output apparatus 200 identifies tag information about a sound source signal and outputs a sound source through a sound source output path for a specific DAC selected among a plurality of DACs based on a tag identification result of the tag information or a user input signal.

The sound source acquiring unit 210 acquires a sound source signal. The sound source acquiring unit 210 according to the exemplary embodiment may acquire the sound source signal from an external device connected to the sound source output apparatus 200 or a separate server, but is not necessarily limited thereto. For example, the sound source acquiring unit 210 may also acquire a sound source signal which has been stored in advance, from a sound source storage unit (not illustrated) provided in the sound source output apparatus 200.

The sound source signal acquired by the sound source acquiring unit 210 may be desirably a music audio file, but is not necessarily limited thereto and may be various sound source files having tag information.

The tag identification processing unit 220 performs an operation of identifying tag information about the sound source signal.

The tag identification processing unit 220 identifies a plurality of information included in the tag information of the sound source signal. Here, the tag identification processing unit 220 may identify at least one of genre information, artist information, and songwriter information from the plurality of information included in the tag information.

The tag identification processing unit 220 analyzes at least one information to determine final genre information for the sound source signal and generates a tag identification result for the determined final genre information. Here, the tag identification result may include information about at least one candidate DAC and at least one candidate DAC filter, corresponding to the final genre information.

The DAC selection control unit 230 performs an operation of selecting a specific DAC among the plurality of DACs. The DAC selection control unit 230 may select the specific DAC based on the user input signal or select the specific DAC based on the tag identification result of the tag information.

Hereinafter, an operation of selecting a specific DAC based on the user input signal will be described.

The DAC selection control unit 230 outputs a selection request signal in accordance with the tag identification result and receives a user input signal corresponding to the selection request signal by means of the manipulation or input of the user. The DAC selection control unit 230 selects a specific DAC among the plurality of DACs in accordance with the input user input signal.

The DAC selection control unit 230 generates a candidate DAC list extracted from the plurality of DACs based on the tag identification result. The DAC selection control unit 230 outputs the selection request signal including the generated candidate DAC list and selects a candidate DAC selected by the user input signal from the candidate DAC list as a specific DAC.

In the meantime, even though it is described that the DAC section control unit 230 outputs a selection request signal including the candidate DAC list extracted from the plurality of DACs based on the tag identification result, the present disclosure is not limited thereto. Therefore, regardless of the tag identification result, a selection request signal including an entire DAC list including all the plurality of DACS may also be output. When the selection request signal including the entire DAC list is output, a specific DAC is selected by the user.

Hereinafter, an operation of selecting a specific DAC based on the tag identification result will be described.

The DAC selection control unit 230 extracts a candidate DAC matching final genre information included in the tag identification result, among the plurality of DACs. The DAC selection control unit 230 selects the extracted candidate DAC as a specific DAC to generate a sound source output path. Here, the sound source output path refers to a path through which the sound source is output by means of the selected specific DAC and the path may include a switch connected to the specific DAC required to output the sound source, an amplifier (AMP), and an output terminal.

In the meantime, the DAC selection control unit 230 combines the specific DAC and a specific DAC filter supplied from the specific DAC after selecting the specific DAC or simultaneously with the selection to generate a sound source output path.

The DAC selection control unit 230 may combine one filter matching the final genre information, among a plurality of DAC filters provided from the selected specific DAC, with the specific DAC. Here, the DAC filter may be one of Super Slow Roll-Off, Short Delay Slow Roll-Off, Slow Roll-Off, Low Dispersion Short Delay, Short Delay Sharp Roll-Off, Sharp Roll-Off, Linear Phase Fast Roll-Off, Minimum Phase Slow Roll-Off, and Hybrid Fast Roll-Off.

When there is a plurality of candidate DACs matching the final genre information, the DAC selection control unit 230 may select the specific DAC based on a performance condition of the candidate DAC or a predetermined priority condition.

For example, when there is a plurality of candidate DACs matching the final genre information, the DAC selection control unit 230 checks a performance condition (for example, previously evaluated conversion performance) for each of the candidate DACs to calculate a first score and calculates a second score for a selection frequency for each of the candidate DACs and then adds the first score and the second score to calculate an added value for each of the DACs, and selects a candidate DAC having the highest added value among the candidate DACs as a specific DAC.

In the meantime, the DAC selection control unit 230 may select the specific DAC by additionally applying a priority. For example, when a priority for each of the candidate DACs is set, the DAC selection control unit 230 checks a weight set for each priority, multiplies the confirmed weight to the added value of the candidate DACS obtained by adding the first score and the second score to calculate a final calculated value of each of the candidate DACS, and select a candidate DAC having the highest final calculated value among the candidate DACs as a specific DAC.

The sound source output unit 240 performs an operation of outputting the sound source converted by the selected specific DAC.

The sound source output unit 240 outputs the sound source by means of a sound output path for the selected specific DAC. Here, the sound source output path includes a switch connected to the selected specific DAC, an amplifier (AMP), and an output terminal.

Figure 3:
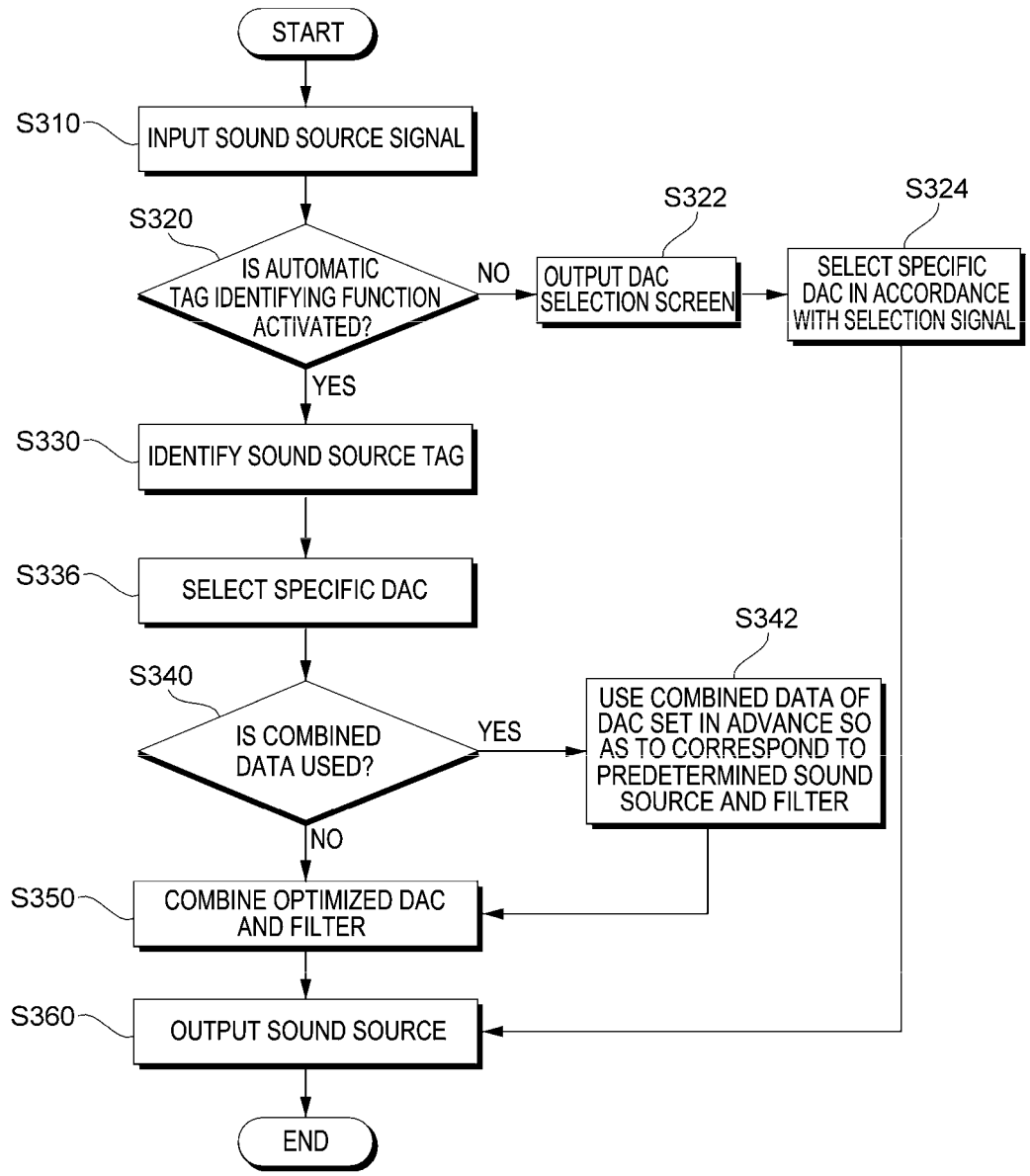
FIG. 3 is a flowchart for explaining a sound source output method according to an exemplary embodiment of the present disclosure.

FIG. 3 is a flowchart for explaining a sound source output method according to an exemplary embodiment of the present disclosure.

The sound source output apparatus 200 acquires a sound source signal in step S310. The sound source output apparatus 200 may acquire the sound source signal from an external device or a separate server, but is not necessarily limited thereto. For example, the sound source output apparatus 200 may acquire a sound source signal which has been stored in advance, from a sound source storage unit (not illustrated) provided in the sound source output apparatus 200.

The sound source signal acquired by the sound source output apparatus 200 may be desirably a music audio file, but is not necessarily limited thereto and may be various sound source files having tag information.

The sound source output apparatus 200 checks whether an automatic tag identifying function is activated in step S320.

The sound source output apparatus 200 identifies a plurality of information included in the tag information of the sound source signal. Here, the sound source output apparatus 200 may identify at least one of genre information, artist information, and songwriter information from the plurality of information included in the tag information.

The sound source output apparatus 200 analyzes at least one information to determine final genre information about the sound source signal and generates a tag identification result for the determined final genre information. Here, the tag identification result may include information about at least one candidate DAC and at least one candidate DAC filter, corresponding to the final genre information.

As a result checked in step S320, if the automatic tag identifying function is inactive, the sound source output apparatus 200 outputs a DAC selecting screen in step S322. Here, the sound source output apparatus 200 may output a selection request signal including an entire DAC list including the plurality of DACs.

Next, the sound source output apparatus 200 selects a combination of a specific DAC in accordance with a selection signal (a user input signal) among the entire DAC list in step S324 and outputs the sound source using the selected combination of the specific DAC in step S326.

In the meantime, as a result checked in step S320, if the automatic tag identifying function is activated, the sound source output apparatus 200 identifies tag information for the sound source signal in step S330.

The sound source output apparatus 200 may identify at least one of genre information, artist information, and songwriter information from the plurality of information included in the tag information of the sound source signal. The sound source output apparatus 200 analyzes at least one information to determine final genre information about the sound source signal and generates a tag identification result for the determined final genre information. Here, the tag identification result may include information about at least one candidate DAC and at least one candidate DAC filter, corresponding to the final genre information.

The sound source output apparatus 200 selects a specific DAC based on the tag identification result in step S336.

The sound source output apparatus 200 extracts a candidate DAC matching final genre information included in the tag identification result, among the plurality of DACs, and selects the extracted candidate DAC as a specific DAC.

Specifically, the sound source output apparatus 200 extracts a candidate DAC matching final genre information included in the tag identification result, from the plurality of DACs. The sound source output apparatus 200 selects the extracted candidate DAC as a specific DAC to generate a sound source output path. Here, the sound source output path refers to a path through which the sound source is output by means of the selected specific DAC and the path may include a switch connected to the specific DAC required to output the sound source, an amplifier (AMP), and an output terminal.

In the meantime, the sound source output apparatus 200 combines the specific DAC and the specific DAC filter supplied from the specific DAC after selecting the specific DAC or simultaneously with the selection to generate a sound source output path.

The sound source output apparatus 200 may combine one filter matching the final genre information, among the plurality of DAC filters provided from the selected specific DAC, with the specific DAC. Here, the DAC filter may be one of Super Slow Roll-Off, Short Delay Slow Roll-Off, Slow Roll-Off, Low Dispersion Short Delay, Short Delay Sharp Roll-Off, Sharp Roll-Off, Linear Phase Fast Roll-Off, Minimum Phase Slow Roll-Off, and Hybrid Fast Roll-Off.

When there is a plurality of candidate DACS matching the final genre information, the sound source output apparatus 200 may select the specific DAC based on a performance condition of the candidate DAC or a predetermined priority condition. For example, when there is a plurality of candidate DACs matching the final genre information, the sound source output apparatus 200 checks a performance condition (for example, previously evaluated conversion performance) for each the candidate DACs to calculate a first score and calculates a second score for a selection frequency for each of the candidate DACs and then adds the first score and the second score to calculate an added value for each of the DACs, and selects a candidate DAC having the highest added value among the candidate DACs as a specific DAC.

In the meantime, the sound source output apparatus 200 may select the specific DAC by additionally applying a priority. For example, when a priority for each of the candidate DACs is set, the sound source output apparatus 200 checks a weight set for each priority, multiplies the confirmed weight to the added value of the candidate DACS obtained by adding the first score and the second score to calculate a final calculated value of each of the candidate DACS, and select a candidate DAC having the highest final calculated value, among the candidate DACs, as a specific DAC.

The sound source output apparatus 200 checks whether to use combined data for the selected specific DAC in step S340.

As a result checked in step S340, if the combined data is used, the sound source output apparatus 200 generates a sound source output path using combined data obtained by combining one DAC filter among DAC filters provided by the specific DAC so as to correspond to a predetermined sound source.

In contrast, as the result checked in step S340, if the combined data is not used, the sound source output apparatus 200 generates a sound source output path using the combined data for a DAC filter optimized for the specific DAC in step S350.

The sound source output apparatus 200 outputs a converted sound source through a sound source output path based on the selected specific DAC in step S360.

Even though in FIG. 3, it is described that the steps are sequentially performed, the present invention is not necessarily limited thereto. In other words, the steps illustrated in FIG. 3 may be changed or one or more steps may be performed in parallel so that FIG. 3 is not limited to a time-series order.

The sound source output method according to the exemplary embodiment described in FIG. 3 may be implemented by an application (or a program) and may be recorded in a terminal (or computer) readable recording media. The recording medium which has the application (or program) for implementing the sound source output method according to the exemplary embodiment recorded therein and is readable by the terminal device (or a computer) includes all kinds of recording devices or media in which computing system readable data is stored.

Figure 4:
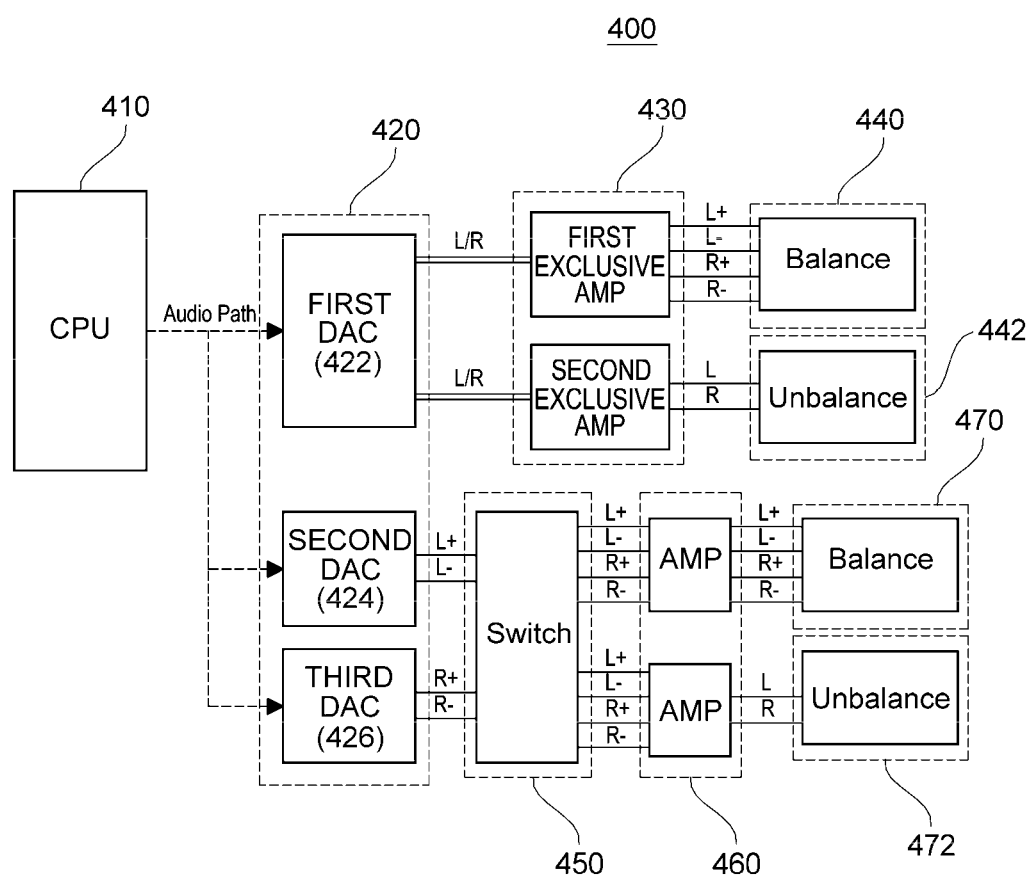
FIG. 4 is an exemplary diagram illustrating a sound source output apparatus applying a plurality of DACs according to an exemplary embodiment of the present disclosure.

FIG. 4 is an exemplary diagram illustrating a sound source reproducing device applying a plurality of DACs according to an exemplary embodiment of the present disclosure.

A sound source reproducing device 400 according to the exemplary embodiment includes a processor 410, a plurality of DACs 420, amplifiers 430 and 460, a switch 450, and output modules 440, 442, 470, 472. The sound source reproducing device 400 of FIG. 4 is an example so that not all blocks illustrated in FIG. 2 are essential components and in the other exemplary embodiment, some blocks included in the sound source reproducing device 400 may be added, modified, or omitted.

All or some of components included in the sound source reproducing device 400 of FIG. 4 may correspond to the sound source output device 200, but is not necessarily limited thereto. For example, the processor 410 of the sound source reproducing device 400 may include the sound source acquiring unit 210, the tag identification processing unit 220, and the DAC selection control unit 230 of the sound source output apparatus 200.

The processor 410 acquires a sound source signal. The processor 410 according to the exemplary embodiment may acquire the sound source signal from an external device connected to the sound source reproducing device 400 or a separate server, but is not necessarily limited thereto. For example, the processor 410 may acquire a sound source signal which has been stored in advance, from a sound source storage unit (not illustrated) provided in the sound source reproducing device 400.

The processor 410 performs an operation of identifying tag information about the sound source signal.

The processor 410 identifies a plurality of information included in the tag information of the sound source signal. Here, the processor 410 may identify at least one of genre information, artist information, and songwriter information from the plurality of information included in the tag information.

The processor 410 analyzes at least one information to determine final genre information about the sound source signal and generates a tag identification result for the determined final genre information. Here, the tag identification result may include information about at least one candidate DAC and at least one candidate DAC filter, corresponding to the final genre information.

The processor 410 performs an operation of selecting a specific DAC among the plurality of DACs. The processor 410 may select the specific DAC based on the user input signal or select the specific DAC based on the tag identification result of the tag information.

When the specific DAC is selected based on the user input signal, the processor outputs a selection request signal in accordance with a tag identification result and receives a user input signal corresponding to the selection request signal by means of the manipulation or input of the user. The processor 410 selects a specific DAC among the plurality of DACs in accordance with the input user input signal.

The processor 410 generates a candidate DAC list extracted from the plurality of DACs based on the tag identification result. The processor 410 outputs the selection request signal including the generated candidate DAC list and selects a candidate DAC selected by the user input signal among the candidate DAC list as a specific DAC.

In the meantime, even though it is described that the processor 410 outputs a selection request signal including the candidate DAC list extracted from the plurality of DACs based on the tag identification result, the present disclosure is not limited thereto. Therefore, regardless of the tag identification result, a selection request signal including an entire DAC list including all the plurality of DACS may also be output. When the selection request signal including the entire DAC list is output, a specific DAC is selected by the user.

When the specific DAC is selected based on the tag identification result, the processor 410 extracts a candidate DAC matching the final genre information included in the tag identification result, among the plurality of DACs. The processor 410 selects the extracted candidate DAC as a specific DAC to generate a sound source output path. Here, the sound source output path refers to a path through which the sound source is output by means of the selected specific DAC and the path may include a switch connected to the specific DAC required to output the sound source, an amplifier (AMP), and an output terminal.

In the meantime, the processor 410 combines the specific DAC and the specific DAC filter supplied from the specific DAC after selecting the specific DAC or simultaneously with the selection to generate a sound source output path.

The processor 410 may combine one filter matching the final genre information, among the plurality of DAC filters provided from the selected specific DAC, with the specific DAC.

Referring to FIG. 4, the sound source reproducing device 400 may generate the sound source output path by the processor 410. Here, the sound source output path may be a path through which a sound source is output through one specific DAC selected among the first DAC 422, the second DAC 424, and the third DAC 426.

For example, when the specific DAC selected by the processor 410 is the first DAC 422, the sound source may be output by the first amplifier 430 which amplifies an output signal of the first DAC 422 and the first output modules 440 and 442. Here, the first output modules 440 and 442 output the sound source in accordance with a balanced or unbalanced output manner.

In the meantime, when the specific DAC selected by the processor 410 is the second DAC 424 or the third DAC 426, the sound source may be output by the second amplifier 460 which amplifies a signal via a switch 450 for matching the output signal of the second DAC 424 or the third DAC 426 and the amplifier and the second output modules 470 and 472. Here, the second output modules 470 and 472 output the sound source in accordance with a balanced or unbalanced output manner.

It will be appreciated that various exemplary embodiments of the present disclosure have been described herein for purposes of illustration, and that various modifications and changes may be made by those skilled in the art without departing from the scope and spirit of the present invention. Accordingly, the exemplary embodiments of the present disclosure are not intended to limit but describe the technical spirit of the present invention and the scope of the technical spirit of the present invention is not restricted by the exemplary embodiments. The protective scope of the exemplary embodiment of the present invention should be construed based on the following claims, and all the technical concepts in the equivalent scope thereof should be construed as falling within the scope of the exemplary embodiment of the present invention.

What is claimed is:

1. A sound source output apparatus which applies a plurality of DACs, the sound source output apparatus, comprising:
   a sound source acquiring unit which acquires a sound source signal;
   a tag identification processing unit which identifies tag information about the sound source signal;
   a DAC selection control unit which selects a specific DAC among a plurality of digital analog converters (DACs) based on a tag identification result of the tag information or a user input signal; and
   a sound source output unit which outputs a sound source which is converted by the selected specific DAC.

2. The sound source output apparatus according to claim 1, wherein the tag identification processing unit identifies at least one information of genre information, artist information, and songwriter information from a plurality of information included in the tag information of the sound source signal and generates the tag identification information about final genre information which is determined by analyzing the at least one information.

3. The sound source output apparatus according to claim 1, wherein the DAC selection control unit outputs a selection request information in accordance with the tag identification result and selects the specific DAC in accordance with the user input signal corresponding to the selection request signal.

4. The sound source output apparatus according to claim 3, wherein the DAC selection control unit outputs the selection request signal including a candidate DAC list extracted based on the tag identification result and selects a candidate DAC selected by the user input signal, among the candidate DAC list, as the specific DAC.

5. The sound source output apparatus according to claim 1, wherein the DAC selection control unit extracts a candidate DAC matching final genre information included in the tag identification result, among the plurality of DACs, and selects the extracted candidate DAC as the specific DAC to generate a sound source output path.

6. The sound source output apparatus according to claim 5, wherein the DAC selection control unit generates the sound source output path by combining the specific DAC and a DAC filter provided by the specific DAC and combines one filter matching the final genre information, among a plurality of DAC filters provided by the specific DAC, with the specific DAC.

7. The sound source output apparatus according to claim 5, wherein when there is a plurality of candidate DACS matching the final genre information, the DAC selection control unit selects the specific DAC based on a performance condition of the candidate DAC or a predetermined priority condition.

8. A method of outputting a sound source by a sound source output apparatus, the method comprising:
   a sound source acquiring step of acquiring a sound source signal;
   a tag identification processing step of identifying tag information about the sound source signal;
   a DAC selection control step of selecting a specific DAC among a plurality of digital analog converters (DACs) based on a tag identification result of the tag information or a user input signal; and
   a sound source output step of outputting a sound source which is converted by the selected specific DAC.

9. The method according to claim 8, wherein in the DAC selection control step, a candidate DAC matching final genre information included in the tag identification result is extracted from the plurality of DACs and the extracted candidate DAC is selected as the specific DAC to generate a sound source output path.

10. The method according to claim 9, wherein in the DAC selection control step, the sound source output path is generated by combining the specific DAC and a DAC filter provided by the specific DAC and one filter matching the final genre information, among a plurality of DAC filters provided by the specific DAC, is combined with the specific DAC.

* * * * *